(12) United States Patent
Mizuguchi et al.

(10) Patent No.: US 7,026,671 B2
(45) Date of Patent: Apr. 11, 2006

(54) MAGNETORESISTIVE EFFECT ELEMENT, MAGNETIC MEMORY DEVICE AND MANUFACTURING METHOD OF MAGNETORESISTIVE EFFECT ELEMENT AND MAGNETIC MEMORY DEVICE

(75) Inventors: Tetsuya Mizuguchi, Kanagawa (JP); Masanori Hosomi, Miyagi (JP); Kazuhiro Ohba, Miyagi (JP); Kazuhiro Bessho, Kanagawa (JP); Yutaka Higo, Miyagi (JP); Tetsuya Yamamoto, Kanagawa (JP); Takeyuki Sone, Miyagi (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 242 days.

(21) Appl. No.: 10/457,492

(22) Filed: Jun. 9, 2003

(65) Prior Publication Data

US 2004/0042129 A1    Mar. 4, 2004

(30) Foreign Application Priority Data

Jun. 20, 2002 (JP) ............................. 2002-180255

(51) Int. Cl.
*H01L 29/76* (2006.01)
(52) U.S. Cl. ................. 257/295; 360/324.12; 360/113; 360/321; 360/324.1; 360/324.2
(58) Field of Classification Search ........... 360/324.12, 360/113, 321, 324.1, 324.2, 313, 317
See application file for complete search history.

(56) References Cited

U.S. PATENT DOCUMENTS 6,157,525 A * 12/2000 Iwasaki et al. ........ 360/324.12
6,671,136 B1 * 12/2003 Arai et al. ................. 360/321
6,822,837 B1 * 11/2004 Kasahara et al. ........ 360/324.2

* cited by examiner

*Primary Examiner*—Mai-Huong Tran
(74) *Attorney, Agent, or Firm*—Robert J. Depke; Trexler, Bushnell, Giangiorgi, Blackstone & Marr, Ltd.

(57) ABSTRACT

A magnetoresistive effect element (1) has an arrangement in which a pair of ferromagnetic material layers (magnetization fixed layer (5) and magnetization free layer (7)) is opposed to each other through an intermediate layer (6) to obtain a magnetoresistive change by causing a current to flow in the direction perpendicular to the layer surface and in which the ferromagnetic material layers are annealed by anneal including rotating field anneal and the following static field anneal. A magnetic memory device comprises this magnetoresistive effect element (1) and bit lines and word lines sandwiching the magnetoresistive effect element (1) in the thickness direction. When the magnetoresistive effect element (1) and the magnetic memory device are manufactured, the ferromagnetic material layers (5, 7) are annealed by rotating field anneal and the following static field anneal. There are provided the magnetoresistive effect element that can obtain excellent magnetic characteristics by controlling magnetic anisotropies of the ferromagnetic material layers, the magnetic memory device including this magnetoresistive effect element and which may have excellent write characteristics, and methods for manufacturing these magnetoresistive effect element and magnetic memory device.

13 Claims, 5 Drawing Sheets

MAGNETORESISTIVE EFFECT ELEMENT, MAGNETIC MEMORY DEVICE AND MANUFACTURING METHOD OF MAGNETORESISTIVE EFFECT ELEMENT AND MAGNETIC MEMORY DEVICE

This application claims priority to Japanese Patent Application Numbers JP2002-180255 filed Jun. 20, 2002 which is incorporated herein by reference.

BACKGROUND OF THE INVENTION

1. Field of the Invention

The present invention relates to a magnetoresistive effect element having an arrangement for obtaining a magnetoresistive effect change by causing a current to flow in the direction perpendicular to the layer surface and a magnetic memory device including this magnetoresistive effect element. Moreover, the present invention relates to a method of manufacturing this magnetoresistive effect element and a method of manufacturing this magnetic memory device.

2. Description of the Related Art

As information communication devices, in particular, personal small information communication devices such as portable terminal devices (e.g. personal digital assistants) are widely spreading, it is requested that devices such as memories and logic devices comprising these information communication devices or portable terminal devices should become higher in performance, such as they should become higher in integration degree, they can operate at higher speed and they can consume lesser electric power. Particularly, technologies that can make nonvolatile memories become higher in density and larger in storage capacity are becoming more and more important as complementary technologies for replacing hard disk devices and optical disk devices with nonvolatile memories because it is essentially difficult to miniaturize hard disk devices and optical disk devices because they have their movable portions (e.g. head seek mechanism and head rotation mechanism).

Flash memories using semiconductors, an FRAM (ferro electric random-access memory) using a ferro dielectric material and so on are known as nonvolatile memories.

However, flash memories have a defect that the information writing speed thereof is slow as the order of microseconds. On the other hand, it has been pointed out that the FRAM cannot be rewritten so many times.

A magnetic memory device called an MRAM (magnetic random-access memory) device that had been described in "Wang et al., IEEE Trans. Magn. 33 (1997), 4498", receives a remarkable attention as a nonvolatile memory that can overcome these defects. This MRAM is simple in structure and therefore can be easily integrated at high integration degree and since the MRAM is able to record by rotation of magnetic moment, it can be rewritten a large number of times. Further, it is expected that the MRAM has very high access time and it has already been confirmed that the MRAM can be operated at speed in the order of nanoseconds.

A magnetoresistive effect element used in this MRAM and especially a ferromagnetic tunnel junction (MTJ (magnetic tunnel junction)) is essentially composed of a ferromagnetic tunnel junction formed by a laminated layer construction of a ferromagnetic material layer, a tunnel barrier layer and a ferromagnetic material layer. In this element, when an external magnetic field is applied to the ferromagnetic material layers under the condition in which a constant current flows through the ferromagnetic material layers, magnetoresistive effect appears in response to a relative angle of the magnetizations of the two ferromagnetic material layers. When the magnetization directions of the two ferromagnetic material layers are anti-parallel, a resistance value becomes the maximum. When the magnetization directions of the two ferromagnetic material layers are parallel to each other, a resistance value becomes the minimum. Functions of the memory element can be achieved when anti-parallel and parallel states of the magnetization directions are produced with application of external magnetic fields.

In particular, in a spin-valve type TMR element, one ferromagnetic material layer is coupled to an adjacent antiferromagnetic material layer in an antiferromagnetic fashion and thereby formed as a magnetization fixed layer whose magnetization direction is constantly made constant. The other ferromagnetic material layer is formed as a magnetization free layer whose magnetization direction is easily inverted with application of external magnetic fields and the like. Then, this magnetization free layer serves as an information recording layer in a magnetic memory.

For the TMR element of a spin-valve structure, a changing ratio of a resistance value in the TMR element is expressed as the following equation (A) where P1, P2 represent spin polarizabilities of the respective ferromagnetic material layers:

$$2P1P2/(1-P1P2) \tag{A}$$

Accordingly, the changing ratio of the resistance value increases as the respective spin polarizabilities increase.

Fundamentally, the MRAM comprises a plurality of bit write lines (so-called bit lines), a plurality of word write lines (so-called word lines) and TMR elements disposed at intersection points between these bit write lines and word write lines as magnetic memory elements as disclosed in Japanese laid-open patent application No. 10-116490, for example. When information is to be written in such MRAM, information is selectively written in the TMR elements by using asteroid characteristics.

In the MRAM, when magnetic characteristics of the TMR elements fluctuate at every element or magnetic characteristics fluctuate when the same element is repeatedly used, there arises a problem in which it becomes difficult to selectively write information by using the asteroid characteristics.

Accordingly, the TMR element is requested to have magnetic characteristics that can draw an ideal asteroid curve.

To draw an ideal asteroid curve, an R-H (resistance-magnetic field) loop obtained magnetic characteristic of the TMR element are measured is free from noises such as a Barkhausen noise, a waveform should have an excellent rectangle property and the magnetization state should be stable so that a coercive force Hc hardly fluctuates.

The Barkhausen noise, the deterioration of rectangle property and the fluctuations of coercive force are caused mainly by magnetic anisotropy of the material. Since these problems arise when the direction and magnitude of the magnetic anisotropy are distributed within the layer surface, control of the direction of the magnetic anisotropy is very important.

SUMMARY OF THE INVENTION

An object of the present invention is to provide a magnetoresistive effect element that can obtain excellent magnetic characteristics by controlling magnetic anisotropies of ferromagnetic material layers.

It is another object of the present invention to provide a magnetic memory device including this magnetoresistive effect element and which can obtain excellent write characteristics.

It is a further object of the present invention to provide a method of manufacturing this magnetoresistive effect element.

It is yet a further object of the present invention to provide a method of manufacturing this magnetic memory device.

According to an aspect of the present invention, there is provided a magnetoresistive effect element in which a pair of ferromagnetic material layers is opposed to each other through an intermediate layer to obtain a magnetoresistive change by causing a current to flow in the direction perpendicular to the layer surface. The ferromagnetic material layers are annealed by anneal including rotating field anneal and the following static field anneal.

According to other aspect of the present invention, there is provided a magnetic memory device which comprises a magnetoresistive effect element having an arrangement in which a pair of ferromagnetic material layers is opposed to each other through an intermediate layer to obtain a magnetoresistive change by causing a current to flow in the direction perpendicular to the layer surface and word lines and bit lines sandwiching the magnetoresistive effect element in the thickness direction, wherein the ferromagnetic material layers are annealed by anneal including rotating field anneal and the following static field anneal.

According to a further aspect of the present invention, there is provided a method of manufacturing a magnetoresistive effect element in which a pair of ferromagnetic material layers is opposed to each other through an intermediate layer to obtain a magnetoresistive change by causing a current to flow in the direction perpendicular to the layer surface. In this case, when this magnetoresistive effect element is manufactured, the ferromagnetic material layers are annealed by anneal including rotating field anneal and static field anneal later on.

In accordance with yet a further aspect of the present invention, there is provided a method of manufacturing a magnetic memory device comprising a magnetoresistive effect element in which a pair of ferromagnetic material layers is opposed to each other through an intermediate layer to obtain a magnetoresistive change by causing a current to flow in the direction perpendicular to the layer surface and word lines and bit lines sandwiching the magnetoresistive effect element in the thickness direction. In this case, when this magnetic memory device is manufactured, the ferromagnetic material layers are annealed by rotating field anneal and static field anneal later on.

According to the arrangement of the magnetoresistive effect element of the present invention, since the ferromagnetic material layers are annealed by anneal including rotating field anneal and the following static field anneal, the magnetic anisotropies of the ferromagnetic material layers are distributed by rotating field anneal. Further, a uniaxial anisotropy is given to the ferromagnetic material layers by the following static field anneal and the magnetic anisotropies of the ferromagnetic material layers are controlled. Thus, it becomes possible to improve a rectangle property of a resistance-external magnetic field curve of the magnetoresistive effect element and to improve fluctuations of a coercive force.

According to the arrangement of the magnetic memory device of the present invention, since this magnetic memory device includes the magnetoresistive effect element and the word lines and the bit lines sandwiching the magnetoresistive effect element in the thickness direction and the magnetoresistive effect element has the arrangement of the magnetoresistive effect element according to the present invention, the magnetic anisotropies of the ferromagnetic material layers are controlled by anneal including the rotating field anneal and the following static field anneal. Hence, it becomes possible to improve the rectangle property of the resistance-external magnetic field curve of the magnetoresistive effect element and to improve the fluctuations of the coercive force. Thus, the shape of the asteroid curve of the magnetoresistive effect element can be improved and information can selectively be written in the magnetic memory device easily and stably.

Further, according to the method of manufacturing the magnetoresistive effect element of the present invention, since the ferromagnetic material layers are annealed by rotating field anneal and the following static field anneal, the magnetic anisotropies of the ferromagnetic material layers are distributed by the rotating field anneal. Further, the uniaxial anisotropy is given to the ferromagnetic material layers by the following static field anneal and the magnetic anisotropies of the ferromagnetic material layers are controlled. Thus, it becomes possible to manufacture the magnetoresistive effect element in which the rectangle property of the resistance-external magnetic field curve of the magnetoresistive effect element and the fluctuations of the coercive force could be improved.

Furthermore, according to the method of manufacturing the magnetic memory device of the present invention, since the ferromagnetic material layers are annealed by the rotating field anneal and the following static field anneal, by controlling the magnetic anisotropies of the ferromagnetic material layers, it becomes possible to manufacture the magnetic memory device in which the rectangle property of the resistance-external magnetic field curve of the magnetoresistive effect element and the fluctuations of the coercive force could be improved and in which information can be selectively written with ease stably.

DESCRIPTION OF THE PREFERRED EMBODIMENTS

The present invention will now be described with reference to the accompanying drawings.

Before describing the embodiment of the present invention, lets us summarize the present invention as follows.

According to the present invention, there is provided a magnetoresistive effect element having an arrangement in which a pair of ferromagnetic material layers is opposed to each other through an intermediate layer so that a magnetoresistive change is obtained by causing a current to flow in the direction perpendicular to the layer surface. In this magnetoresistive effect element, the ferromagnetic material layers are annealed by anneal including rotating field anneal and the following static field anneal.

According to the present invention, in the magnetoresistive effect element, at least one of the ferromagnetic material layers is made of an amorphous or microcrystal material.

According to the present invention, the magnetoresistive effect element is a tunnel magnetoresistive effect element using a tunnel barrier layer made of an insulating material or a semiconductor material as an intermediate layer.

According to the present invention, the magnetoresistive effect element has a laminated ferri structure.

According to the present invention, there is provided a magnetic memory device comprising a magnetoresistive effect element having an arrangement in which a pair of ferromagnetic material layers is opposed to each other through an intermediate layer so that a magnetoresistive change is obtained by causing a current to flow in the direction perpendicular to the layer surface and word lines and bit lines sandwiching the magnetoresistive effect element in the thickness direction and in which the ferromagnetic material layers are annealed by anneal including rotating field anneal and succeeding static field anneal.

According to the present invention, in the magnetic memory device, at least one of the ferromagnetic material layers is made of an amorphous or microcrystal material.

According to the present invention, in the magnetic memory device, a magnetoresistive effect element is a tunnel magnetoresistive effect element using a tunnel barrier layer made of an insulating or semiconductor material as the intermediate layer.

According to the present invention, in the magnetic memory device, the magnetoresistive effect element has a laminated ferri structure.

Figure 1:
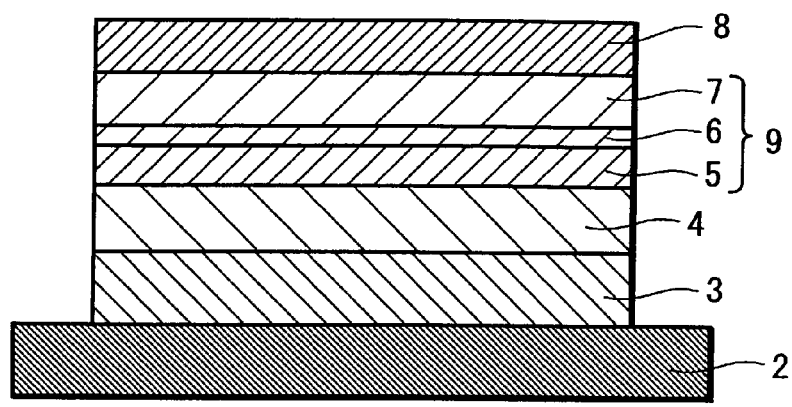
FIG. 1 is a schematic diagram showing an arrangement of a TMR element according to an embodiment of the present invention.

FIG. 1 is a schematic diagram showing an arrangement of a magnetoresistive effect element according to an embodiment of the present invention. The embodiment shown in FIG. 1 shows the case in which the present invention is applied to a tunnel magnetoresistive effect element (hereinafter referred to as a "TMR element").

This TMR element 1 comprises a substrate 2 made of a suitable material such as silicon on which there are laminated an underlayer 3, an antiferromagnetic material layer 4, a magnetization fixed layer 5 serving as a ferromagnetic material layer, a tunnel barrier layer 6, a magnetization free layer 7 serving as a ferromagnetic material layer and a top-coat layer 8, in that order.

Specifically, this TMR element is a so-called spin-valve type TMR element in which one of the ferromagnetic material layers is formed as the magnetization fixed layer 5 and the other ferromagnetic material layer is formed as the magnetization free layer 7. A ferromagnetic tunnel junction 9 is formed by sandwiching the tunnel barrier layer 6 with the magnetization fixed layer 5 and the magnetization free layer 7 that serve as a pair of ferromagnetic material layers.

Then, when this TMR element 1 is applied to a magnetic memory device and the like, the magnetization free layer 7 serves as an information recording layer in which information can be recorded.

The antiferromagnetic material layer 4 is the layer in which when the antiferromagnetic material layer 4 is coupled to the magnetization fixed layer 5 serving as one of the ferromagnetic material layers in an antiferromagnetic fashion, the magnetization direction of the magnetization fixed layer 5 can be prevented from being inverted with application of a write current magnetic field so that the magnetization direction of the magnetization fixed layer 5 can be made constant constantly. Specifically, in the TMR element 1 shown in FIG. 1, the magnetization direction of only the magnetization free layer 7 that is the other ferromagnetic material layer is inverted with application of external magnetic fields and the like. Since the magnetization free layer 7 becomes the layer in which information is to be recorded when the TMR element 1 is applied to a suitable device such as a magnetic memory device, this magnetization free layer is referred to as an "information recording layer".

As a material that comprises the antiferromagnetic material layer 4, there can be used Mn alloy containing Fe, Ni, Pt, Ir, Rh and the like, Co oxide, Ni oxide and the like.

In the spin-valve type TMR element 1 shown in FIG. 1, the magnetization free layer 7 is coupled to the antiferromagnetic material layer 4 in an antiferromagnetic fashion and thereby the magnetization direction thereof is made constant. Therefore, the magnetization direction of the magnetization fixed layer 5 can be prevented from being inverted with application of current magnetic field used when information is written in the TMR element 1.

The tunnel barrier layer 6 is a layer that can magnetically separate the magnetization fixed layer 5 and the magnetization free layer 7 from each other and through which a tunnel current can flow.

As a material comprising the tunnel barrier layer 6, there can be used oxide such as Al, Mg, Si, Li, Ca, nitride, an insulating material such as halide.

Such tunnel barrier layer 6 can be obtained by oxidizing or nitriding a metal film that has been deposited by a suitable method such as sputtering or vapor deposition.

Moreover, this tunnel barrier layer 6 can be obtained by a CVD (chemical vapor deposition) method using organic metals, oxygen, ozone, nitrogen, halogen, halide gas and the like.

In this embodiment, in particular, the ferromagnetic tunnel junction 9 including the magnetization fixed layer 5 serving as the ferromagnetic material layer and the magnetization free layer 7 are annealed by anneal including rotating field anneal and the following static field anneal.

According to this arrangement, a rectangle property of an R-H curve can be improved and fluctuations of a coercive force can be reduced.

Figure 2:
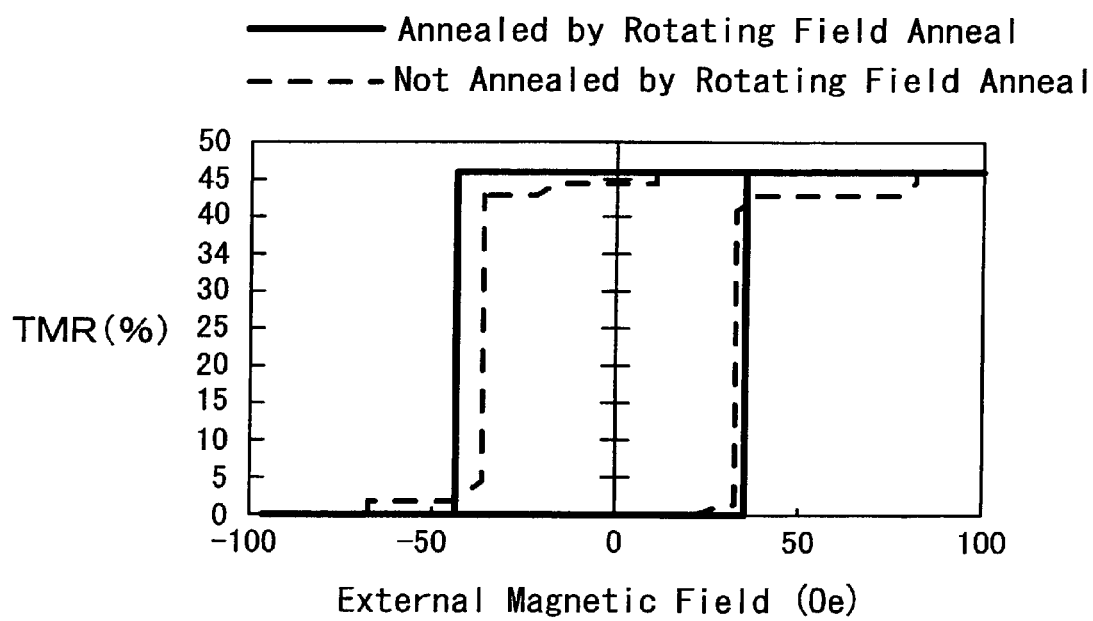
FIG. 2 is a graph showing compared results of resistance-external magnetic field curves obtained when the TMR element is annealed with or without rotating field anneal.

Spin-valve type TMR elements in which the magnetization free layer 7 is made of an amorphous ferromagnetic material having a composition of Co72Fe8B20 (atomic percent) were manufactured with the following static field anneal after rotating field anneal or with only static field anneal without rotating field anneal, respectively. FIG. 2 shows measured results of resistance-external magnetic field curves of these spin-valve type TMR elements. In FIG. 2, solid lines show measured results of resistance-external magnetic field curves of the TMR element that has been annealed by rotating field anneal and broken lines show measured results of resistance-external magnetic field curves of the TMR element that has not been annealed by rotating field anneal. In FIG. 2, the vertical axis shows ratios (%) of change of resistance obtained by the TMR (tunnel magnetoresistive effect) instead of a resistance value.

As it is clear from FIG. 2, in the TMR element that has been annealed by rotating field anneal, the rectangle property of the R-H curve can be improved and the Barkhausen noise also can be reduced as compared with the TMR element that has not been annealed by the rotating field anneal. Therefore, according to the present invention, the shape of the asteroid curve can be improved and the write characteristics can be improved. Thus, it becomes possible to reduce write errors.

The reason for this can be considered as follows. Direction and magnitude of magnetic anisotropy produced immediately after the ferromagnetic films were deposited are locally distributed within the layer surface. Therefore, when the TMR element is annealed by rotating field anneal, if the magnetic anisotropy is distributed, then the magnetic anisotropy within the layer surface is determined by conditions of static field anneal that can provide a uniaxial magnetic anisotropy later on. Thus, the characteristics of the TMR element can be made uniform.

The ferromagnetic material layers should more preferably be made of an amorphous or microcrystal material whose main component contains any one of Fe, Co, Ni or more than a plurality of these elements.

Similarly, if crystallized alloy whose main component contains Fe, Co, Ni has a thickness less than 3 nm, such crystallized alloy is brought to the state close to the amorphous state so that effects of the above-mentioned rotating field anneal can be achieved. However, since crystal magnetic anisotropy exists in this alloy and it is difficult to control this crystal magnetic anisotropy with anneal, effects of the rotating field anneal can be decreased as compared with the amorphous material.

Figure 3:
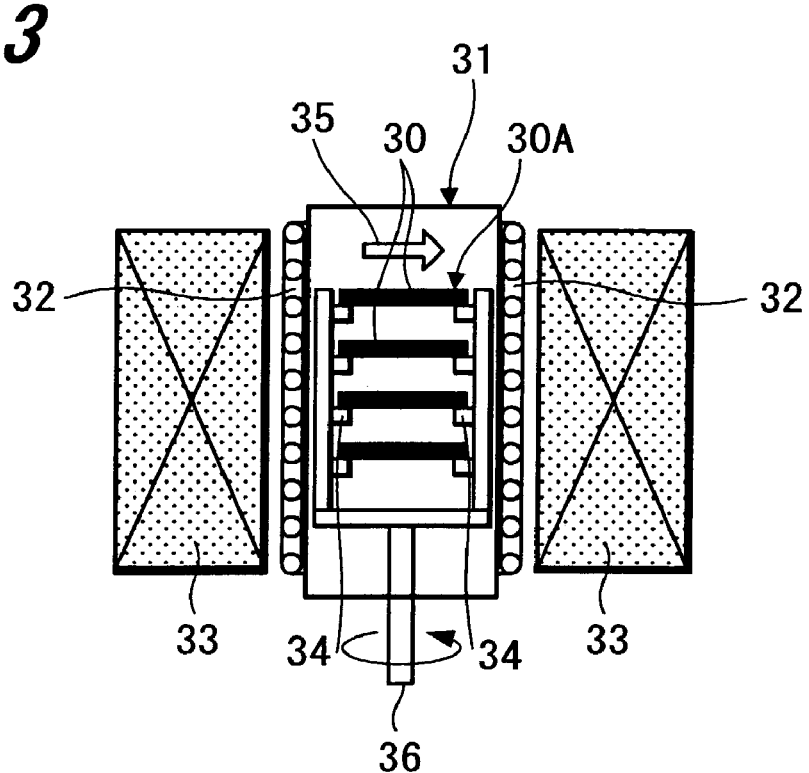
FIG. 3 is a schematic diagram showing an example of an annealing furnace for use with rotating field anneal.

An annealing furnace that can carry out rotating field anneal has an arrangement shown in FIG. 3, for example.

In this annealing furnace, as shown in FIG. 3, a heater 32 is located in the outside of a vacuum chamber 31 and a magnet 33 is located in the outside of the heater 32.

Within the vacuum chamber 31, there is provided a rack 34 which accommodates therein wafers 30. This rack 34 is attached to a wafer rotary shaft 36 which is extended to the outside of the vacuum chamber 31. As shown by an arrow in FIG. 3, this wafer rotary shaft 36 may rotate around the shaft. In unison with rotation of this wafer rotary shaft 36, the rack 34 and the wafers 30 are rotated around the shaft.

In this annealing furnace, the TMR elements are annealed by rotating field anneal as follows.

First, the wafer 30 on which the TMR element is to be formed is set on the rack 34 within the vacuum chamber 31 in such a manner that a major surface 30A of the wafer 30 may become parallel to the direction of the magnetic field produced by the magnet 33.

Then, while the wafer rotary shaft 36 is being rotated, the wafer 30 is heated by the heater 32 and the magnetic field is applied to the wafer 30 by the magnet 33, whereby the TMR element on the wafer 30 can be annealed by rotating field anneal.

When the TMR element is annealed by static field anneal after the rotating field anneal by using the annealing furnace having this arrangement, rotation of the wafer rotary shaft 36 may be stopped and the TMR element may be annealed by anneal using the heater 32.

Although the upper limit of temperature in the rotating field anneal is determined by temperature at which the material is crystallized when the ferromagnetic material layer is made of an amorphous or microcrystal material, the upper limit of the above-mentioned temperature may be selected to be less than 400° C. from a standpoint of balance with heat-resisting property of the TMR element at maximum.

On the other hand, although the lower limit of temperature in rotating field anneal differs depending upon materials of respective layers comprising the TMR element, such lower limit of temperature becomes more than 150° C. at minimum from a standpoint of temperatures that should be higher than the temperature required in the manufacturing process of the TMR element. This relationship applies for temperature used in the static field anneal following the rotating field anneal as well.

A rotation speed of a magnetic field in rotating field anneal is not limited in particular. A magnetic field may be rotated in order to obtain a satisfactory revolution rate.

Since rotating field anneal is carried out in order to improve the magnetization inverting characteristics of the ferromagnetic material layer, at least the magnetization free layer 7, more preferably, both of the magnetization free layer 7 and the magnetization fixed layer 5 should be annealed by rotating field anneal, whereby effects for improving the magnetic characteristics can be achieved more remarkably.

To make the above-mentioned anneal become more effective, it is desired that the film thickness of the amorphous or microcrystal material for use in the magnetization free layer 7 should be selected to be higher than 1 nm and less than 5 nm. If the film thickness falls within this range, then satisfactory magnetic characteristics can be maintained. If the film thickness of the magnetization free layer 7 is less than 1 nm, then magnetic characteristics are deteriorated considerably by mutual diffusion produced by heat. On the contrary, if the film thickness of the magnetization free layer 7 exceeds 15 nm, then the coercive force of the TMR element 1 increases excessively and there is then the risk that the TMR element will become inappropriate when in actual use.

Similarly, when the magnetization fixed layer 5 also is made of the amorphous or microcrystal material, in order to make the above-mentioned anneal more effective, it is desired that the film thickness of the amorphous or microcrystal material for use with the magnetization fixed layer 5 should be selected to be higher than 0.5 nm and less than 6 nm. If the film thickness falls within this range, then satisfactory magnetic characteristics can be maintained. If the film thickness of the magnetization fixed layer 5 is less than 0.5 nm, then magnetic characteristics are deteriorated considerably due to mutual diffusion caused by heat. On the contrary, if the film thickness of the magnetization fixed layer 5 exceeds 6 nm, there is then the risk that an exchange-couple magnetic field with the antiferromagnetic material layer 4 will not be obtained sufficiently.

According to the TMR element 1 of this embodiment, if the TMR element 1 is annealed by anneal including the rotating field anneal, then the rectangle property of the R-H curve can be improved and the Barkhausen noise can be decreased by controlling the magnetic anisbtropies of the ferromagnetic material layers 5, 7. Moreover, the shape of the asteroid curve of the TMR element 1 can be improved by controlling the fluctuations of the coercive force Hc.

According to this arrangement, when the YMR element 1 is applied to a magnetic memory device including a large number of TMR elements, for example, the shape of the asteroid curve of the TMR element 1 can be improved and write characteristics can be improved, whereby write errors can be decreased.

When the present invention is applied to the magnetic head and the magnetic sensor including the TMR element, it becomes to suppress the inverted magnetic field from being displaced from a design value, to increase a yield in the manufacturing process and to prevent malfunctions.

The present invention is not limited to the TMR element 1 in which the magnetization fixed layer 5 and the magnetization free layer 7 shown in FIG. 1 are respectively formed of single layers.

Figure 4:
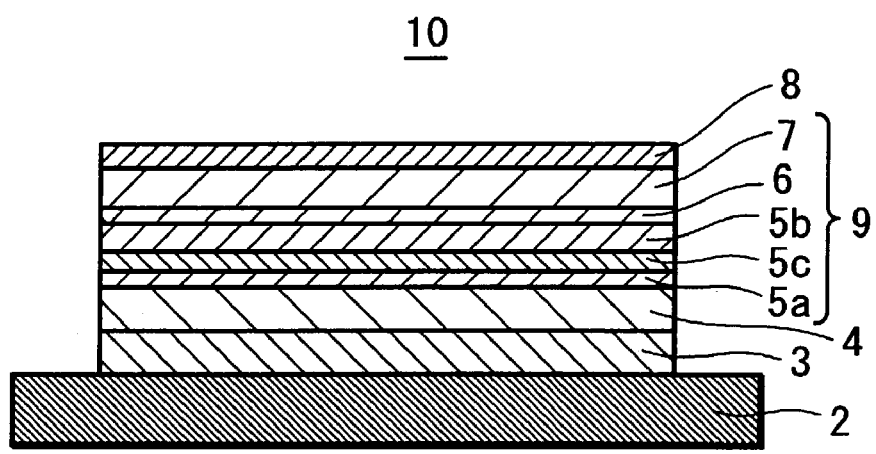
FIG. 4 is a schematic diagram showing an arrangement of a TMR element having a laminated ferri structure.

As shown in FIG. 4, for example, even when the TMR element has a laminated ferri structure in which the magnetization fixed layer 5 has a nonmagnetic conductive layer 5c sandwiched by a first magnetization fixed layer 5a and a second magnetization fixed layer 5b, the effects of the present invention can be achieved.

In the TMR element 10 shown in FIG. 4, the first magnetization fixed layer 5a is coupled to the antiferromagnetic material layer 4 and the first magnetization fixed layer 5a has a strong uniaxial magnetic anisotropy caused by exchange mutual action that acts on these layers. Moreover, since the second magnetization fixed layer 5b becomes the ferromagnetic material layer in which the second magnetization fixed layer 5b is opposed to the magnetization free layer 7 through the tunnel barrier layer 6 and in which the spin direction thereof is compared with that of the magnetization free layer 7 and is directly concerned with an MR ratio, this second magnetization fixed layer is referred to as a "reference layer".

As a material for use with the nonmagnetic conductive layer 5c having the laminated ferri structure, there may be enumerated Ru, Rh, Ir, Cu, Cr, Au, Ag and the like, for example. In the TMR element 10 shown in FIG. 4, since other layers have arrangements substantially similar to those of the TMR element 1 shown in FIG. 1, they are denoted by the identical reference numerals to those of FIG. 1 and therefore need not be described in detail.

Even in the TMR element 10 having the laminated ferri structure, when the TMR element 10 is annealed by rotating field anneal and the following static field anneal, similarly to the TMR element 1 shown in FIG. 1, the rectangle property of the R-H curve can be improved and the Barkhausen noise can be decreased. Moreover, the shape of the asteroid curve of the TMR element 10 can be improved by suppressing the fluctuations of the coercive force Hc.

While the TMR elements (tunnel magnetoresistive effect elements) 1, 10 are used as the magnetoresistive effect element as described above, the present invention is not limited thereto and can be applied to other magnetoresistive effect element having an arrangement in which a pair of ferromagnetic material layers is opposed to each other through an intermediate layer so that a magnetoresistive effect change can be obtained by causing a current to flow in the direction perpendicular to the layer surface.

The present invention can be applied to a giant magnetoresistive effect element (GMR element) using a nonmagnetic conductive layer such as Cu as an intermediate layer, for example, a giant magnetoresistive effect element having an arrangement in which a magnetoresistive effect can be obtained by causing a current to flow in the direction perpendicular to the layer surface, i.e. so-called CPP (current perpendicular to plane) type GMR element.

Further, the materials of the magnetization fixed layer and the antiferromagnetic material layer and the existence of the laminated ferri structure on the side of the magnetization fixed layer may be variously modified so long as the essence of the present invention is not degraded.

A magnitude of magnetic field in rotating field anneal may be greater than a magnetic field in which the magnetization free layer should be saturated, i.e. all magnetizations in the magnetization free layer should be oriented in the same direction.

In ordinary soft magnetic material, magnitude of magnetic field of such soft magnetic material may be selected to be greater than its anisotropic magnetic field and may be about 100 Oe. Hence, an upper limit of such magnitude of magnetic field is not necessary, in particular. However, this is the case in which the dimension (x, y) of the layer surface direction of the magnetic film. is sufficiently larger than the film thickness (z). However, when the magnetic film has a dimension in which a demagnetized magnetic field is applied to the film, for example, since magnetic field for canceling the magnitude of this demagnetized magnetic field out becomes necessary, a larger magnetic field whose magnitude ranges from approximately 200 to 500 Oe should be applied.

The range of magnitude of magnetic field in the static field anneal after the rotating field anneal, for example, differs depending upon the structure, film thickness and characteristics of the magnetization fixed layer 5 because the static field anneal serves as anneal for determining a bias applied from the antiferromagnetic material layer 4 to the magnetization fixed layer 5 in an arrangement (so-called bottom-spin type) in which the magnetization free layer 7 is located above the magnetization fixed layer 5 like the TMR element 1 according to this embodiment.

For example, when the magnetization fixed layer 5 is made of only a CoFe film (single layer) having a film thickness of 2 nm and the material of the antiferromagnetic material layer 4 is FeMn, RhMn, IrMn and the like, a magnetic field of approximately 1 kOe is sufficient.

In the arrangement in which this magnetization fixed layer 5 is made of only a CoFe film (single layer) having a film thickness of 2 nm, if the material of the antiferromagnetic material layer 4 is PtMn and the like, a magnetic field of approximately 3 kOe should be applied.

Further, when the magnetization fixed layer 5 has the laminated ferri structure so that the strong antiferromagnetic coupling is formed like the TMR element 10 and the like shown in FIG. 4, all of a plurality of magnetic layers forming this antiferromagnetic coupling should have the magnetizations of the same direction. If the magnetization fixed layer is the magnetization fixed layer 5 having the structure of CoFe (2 nm)/Ru (0.8 nm)/CoFe (2 nm), for example, a magnetic field of approximately 10 kOe becomes necessary.

On the other hand, in the rotating field anneal and the static field anneal, although the upper limit of the magnitude of the magnetic field is not specified, a magnetic field applying means should be made large in size in order to increase a magnetic field and the magnitude of the magnetic field may be set to a suitable one.

The magnetoresistive effect element such as the above-mentioned TMR elements 1, 10 is suitable for use with the magnetic memory device such as the MRAM. The MRAM using the TMR element according to the present invention will be described with reference to the drawings.

Figure 5:
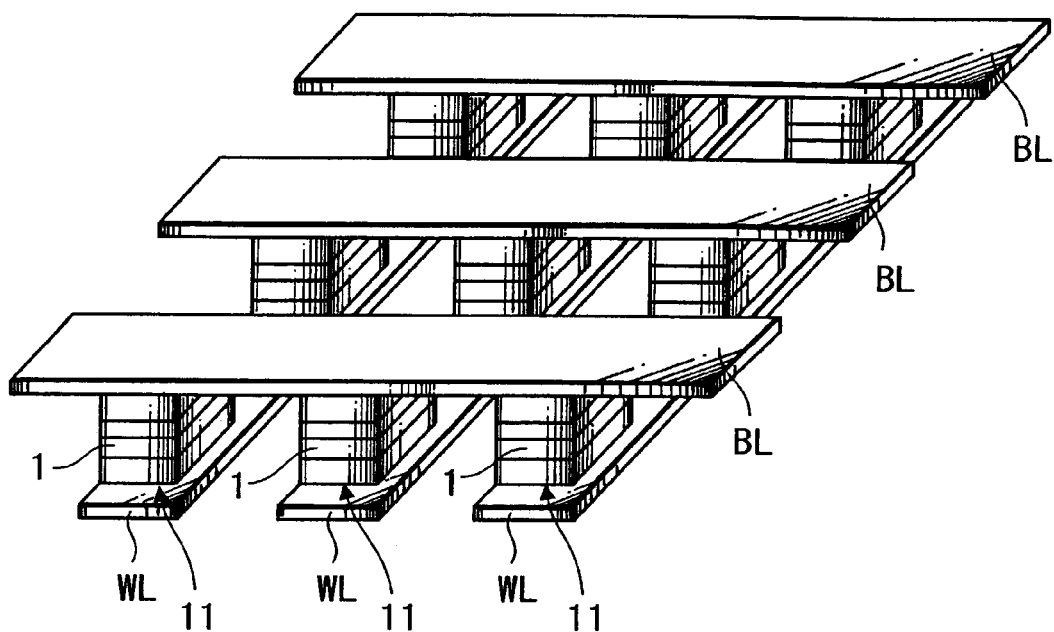
FIG. 5 is a schematic diagram of an arrangement showing a main portion of a crossing-point type MRAM array that includes the inventive TMR element as a memory cell.

FIG. 5 shows a crossing-point type MRAM array which contains TMR elements according to the present invention. This MRAM array includes a plurality of word lines WL and bit lines BL that are intersecting with the word lines and contains memory cells 11 formed by TMR elements according to the present invention which are provided at the intersecting points of the word lines WL and the bit lines BL. Accordingly, 3×3 memory cells are disposed in an XY matrix fashion for this MRAM array.

In the magnetoresistive effect element having the arrangement in which the TMR element for use with the MRAM array is not limited to the TMR element 1 shown in FIG. 1 and may be the TMR element 10 having the laminated ferri structure and the like shown in FIG. 4 for obtaining a magnetoresistive change by causing a current to flow in the direction perpendicular to the layer surface, if the TMR element is annealed by rotating field anneal and the following static field anneal, then the magnetoresistive effect element may have any arrangement.

Figure 6:
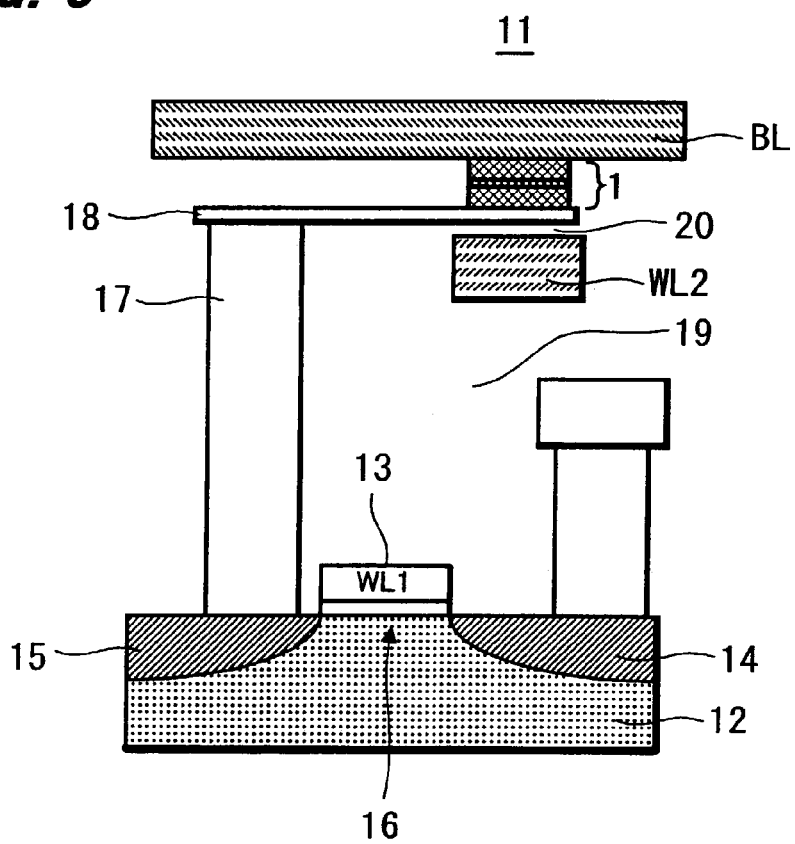
FIG. 6 is a cross-sectional view showing the memory cell in FIG. 5 in an enlarged-scale.

Further, FIG. 6 is a schematic diagram showing an arrangement of a cross-section of a single memory cell portion that is picked up from a plurality of memory cells contained in the memory device.

As shown in FIG. 6, in the respective memory cell portions, a transistor 16 composed of a gate electrode 13, a source region 14 and a drain region 15 is disposed, for example, on a silicon substrate 12. The gate electrode 13 is composed as a word line WL1 for reading. A word line (equivalent to the aforementioned word write line) WL2 for writing is formed on the gate electrode 13 through an insulating layer. A contact metal 17 is connected to the drain region 15 of the transistor 16. Further, an underlayer 18 is connected to the contact metal 17. The TMR element 1 according to the present invention is formed on this underlayer 18 at its position opposing upwardly to the write word line WL2. A bit line (equivalent to the aforementioned bit write line) BL perpendicular to the word lines WL1, WL2 is formed on this TMR element 1. The underlayer 18 is used to electrically connect the TMR element 1 and the drain region 15 which are different in position on the plane and therefore is referred to as a "bypass".

This MRAM includes an interlayer insulating film 19 and an insulating film 20 for insulating the respective word lines WL1, WL2 and the TMR element 1 from each other, a passivation film (not shown) for protecting the whole of the MRAM and the like.

Since this MRAM includes the TMR element 1 in which the magnetic anisotropy of the magnetization free layer 7 is controlled by anneal including rotating field anneal and the following static field anneal, noises in the R-H curve can be decreased and the asteroid characteristics can be improved so that write errors can be decreased.

Figure 7A:
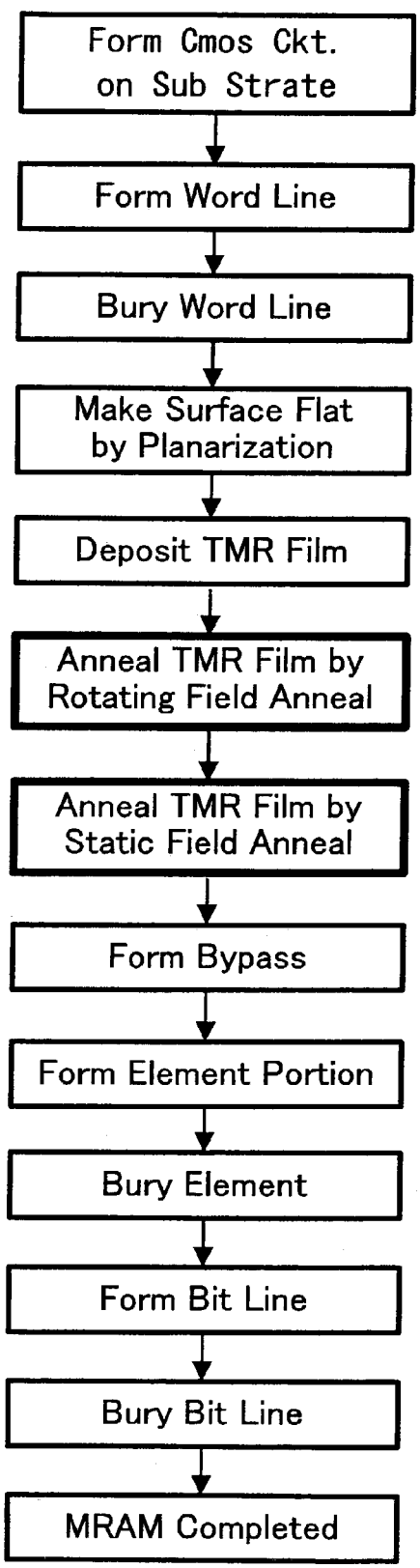
FIGS. 7A and 7B are diagrams showing examples of process flowcharts used when the MRAM is manufactured according to the present invention.
Figure 7B:
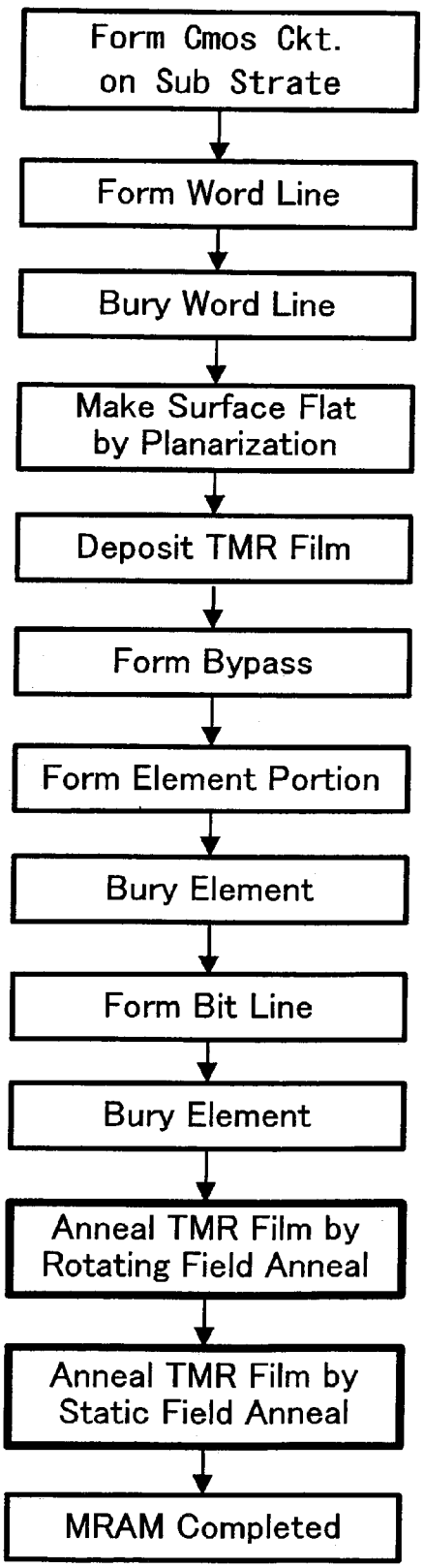

FIGS. 7A and 7B show process charts used when the MRAM is manufactured by the manufacturing method according to the present invention.

Processes required until a TMR film is deposited after a CMOS (complementary metal oxide semiconductor) circuit (e.g. the transistor 16 shown in FIG. 6) has been formed on the substrate, a word line (e.g. W2 shown inFIG. 6) has been formed, the word line has been buried and the surface has been made flat by planarization are made common to FIGS. 7A and 7B.

In the process chart shown in FIG. 7A, immediately after the TMR film has been formed, the TMR film is annealed by rotating field anneal and the following static field anneal. Then, processes of a bypass forming process, i.e. patterning of the underlayer 18 shown in FIG. 6, an element portion forming process, i.e. patterning of the TMR element 1, an element burying process, i.e. a process for burying the TMR element 1 by the insulating film, a bit line forming process and a bit line burying process are carried out, respectively.

In the process chart shown in FIG. 7B, the TMR film is formed. Then, after processes of a bypass forming process, an element portion forming process, an element burying process, a bit line forming process and a bit line burying process have been carried out, the TMR element is annealed by rotating field anneal and the following static field anneal.

Although it is desired that the TMR film should be annealed by rotating field anneal and the following static field anneal after the TMR film has been deposited, the TMR element has to be annealed by rotating field anneal and the following static field anneal after at least the magnetization free layer 7 in the TMR film has been deposited.

In the case of the arrangement in which the magnetization fixed layer and the magnetization free layer are disposed in opposite order to that of the embodiment (so-called bottom-spin type), i.e. the arrangement in which the magnetization free layer is formed on the substrate side and the magnetization fixed layer and the antiferromagnetic material layer are formed above the magnetization free layer (so-called top-spin type), after the ferromagnetic film of the magnetization free layer has been deposited and the TMR film has been annealed by rotating field anneal, the magnetization fixed layer and the antiferromagnetic film are deposited. Thereafter, the TMR element is annealed by static field anneal in order to control the magnetic anisotropy of the magnetization free layer and in order to regulate the antiferromagnetic material layer (to determine the above-mentioned bias).

Specifically, so long as the TMR element is annealed by rotating field anneal and the following static field anneal in that order, other processes can be carried out during these two anneals.

In particular, as shown in FIG. 7A, if the TMR element is annealed by rotating field anneal and static field anneal prior to the element portion forming process, i.e. patterning of the TMR element 1, effects achieved by these annealing processes can be enhanced most. The reason for this is that effects may not be achieved sufficiently with application of sufficient magnetic fields depending upon the shapes of the end portions of very small patterns and the pattern shapes after the TMR element 1 has been treated by patterning.

If there is a process in which temperature becomes very close to temperatures in these anneals after the TMR element 1 had been annealed by rotating field anneal and static field anneal, there is then a possibility that uniform magnetization will be damaged. Thus, the TMR element 1 has to be annealed by static field anneal after the above-mentioned process.

INVENTIVE EXAMPLES

Specific inventive examples to which the present invention is applied will be described with reference to the experimental results.

Figure 8:
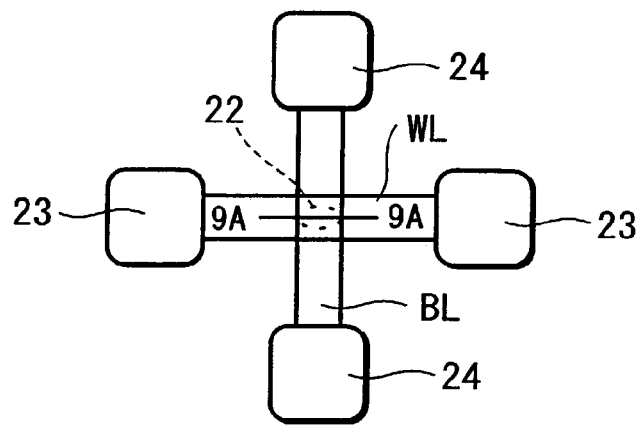
FIG. 8 is a plan view of a TEG (test element group) for use in evaluating the TMR element.
Figure 9:
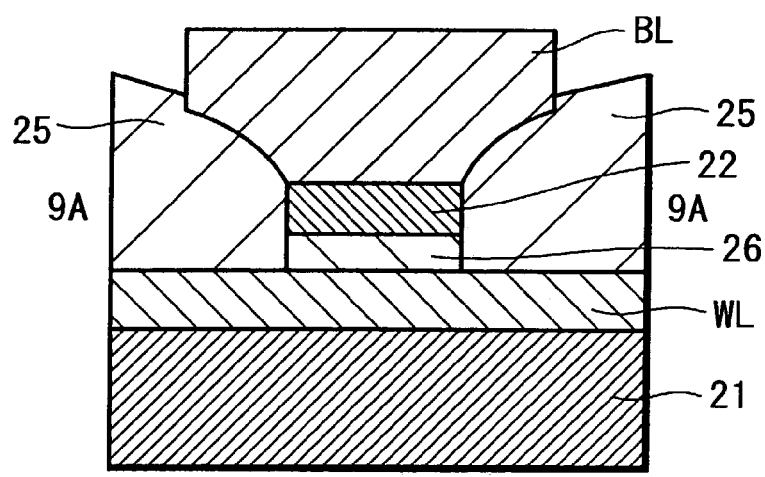
FIG. 9 is a cross-sectional view taken along the line 9A—9A in FIG. 8.

Although the MRAM includes the switching transistor 16 other than the TMR element 1 as shown in FIG. 6, according to the inventive examples, in order to examine the TMR characteristics, characteristics of a wafer in which only a ferromagnetic tunnel junction is formed as shown in FIGS. 8 and 9 had been measured.

First, we have examined effects achieved by rotating field anneal (RFA) when the magnetization free layers of the ferromagnetic tunnel junctions, which were made of various kinds of materials, were annealed by rotating field anneal (RFA).

SAMPLE 1

FIG. 8 is a plan view and FIG. 9 is a cross-sectional view taken along the line 9A—9A in FIG. 8. As shown in FIGS. 8 and 9, as a characteristic evaluation element TEG (Test Element Group), there was manufactured a structure in which a word line WL and a bit line BL are crossed on a substrate 21 and in which a TMR element 22 is formed on a portion in which these word line WL and bit line BL are crossing each other. In this TEG, the TMR element 22 is shaped like an ellipse having a minor-axis of 0.5 mm×a major-axis 1.0 mm. Terminal pads 23, 24 are formed at respective ends of the word line WL and the bit line BL, and the word line WL and the bit line BL are electrically insulated from each other by insulating films 25, 26, each of which is made of $Al_2O_3$.

The manner in which the TEG shown in FIGS. 8 and 9 was manufactured will be described more fully below.

First, there was prepared a 0.6 mm-thick silicon substrate 21 on which surface there was formed a heat oxide film (having a thickness of 2 nm).

Next, after a material of a word line has been deposited on the silicon substrate 21 and the material of the word line deposited on the silicon substrate 21 has been masked by photolithography, other portions than the word line were selectively etched away by Ar (argon) ion plasma laser and thereby the word line WL was formed. At that time, other areas than the word line WL were etched away up to the depth of 5 nm of the silicon substrate 21.

Thereafter, an insulating film 26 was formed on the surface so as to cover the word line WL and the surface is made flat by planarization.

Subsequently, a TMR element 22 having the following layer arrangement (1) was manufactured by well-known lithography and etching. In the layer arrangement (1), the left-hand side portions of slashes show the sides of the substrate and numerical values in parentheses show respective film thicknesses.

Ta(3 nm)/Cu(100 nm)/PtMn(20 nm)/CoFe(3 nm)/Ru(0.8 nm)/CoFe(2.5 nm)/Al(1 nm)—$O_x$/magnetization free layer (t nm)/Ta(5 nm)—(1)

In the above-described layer arrangement (1), the composition of the magnetization free layer was selected to be Co72Fe8B20 (atomic percent) and the film thickness t of the magnetization free layer was selected to be 4 nm.

The composition of each CoFe film was selected to be Co75Fe25 (atomic percent).

The Al—$O_x$ film in the tunnel barrier layer 6 was formed in such a manner that after a metal Al film having a thickness of 1 nm has been deposited by DC sputtering, the metal Al film was oxidized by plasma ion laser produced from ICP (induced coupling plasma) under the condition in which a flow rate of oxygen/argon ion gas was selected to be 1:1 and pressure of chamber gas was selected to be 0.1 mTorr. The oxidation time can be varied depending upon ICP plasma output and was selected to be 30 seconds in the inventive examples.

Other films than the Al—$O_x$ film in the tunnel barrier layer 6 were deposited by DC magnetron sputtering.

Next, the resultant sample was annealed by rotating field anneal within the rotating field annealing furnace in the magnetic field of 200 Oe at 300° C. for an hour. The arrangement of the rotating field anneal furnace was substantially similar to that of the annealing furnace shown in FIG. 3 and the revolution rate of the rotary shaft was selected to be 10 r.p.m.

Next, in the rotating field annealing furnace, rotation of the rotary shaft was stopped and the resultant sample was annealed (static field anneal) in the magnetic field of 10 kOe at 280° C. for 10 hours. Then, the PtMn layer serving as the antiferromagnetic material layer was annealed so that the antiferromagnetic material layer may be regulated and thereby the ferromagnetic tunnel junction 9 was formed.

Subsequently, the TMR element 22 having the plane pattern shown in FIG. 8 was formed by patterning the TMR element 22 and the insulating film 26 formed under the TMR element 22.

Further, the insulating film 25 having a thickness of approximately 100 nm was deposited by sputtering $Al_2O_3$. Furthermore, the bit line BL and the terminal pad 24 were formed by photolithography and the TEG shown in FIGS. 8 and 9 were obtained.

SAMPLE 2

A TEG was obtained in a similar manner to that of the sample 1 except that the composition of the magnetization free layer 7 was selected to be Co70.5Fe4.5Si15B10 (atomic percent) and that the film thickness of the magnetization free layer 7 was selected to be 4 nm.

SAMPLE 3

A TEG was obtained in a similar manner to that of the sample 1 except that the composition of the magnetization free layer 7 was selected to be Co81Zr4Nb12Ta3 (atomic percent) and that the film thickness of the magnetization free layer 7 was selected to be 4 nm.

SAMPLE 4

A TEG was obtained in a similar manner to that of the sample 1 except that the composition of the magnetization free layer 7 was selected to be Co75Fe25 (atomic percent) and that the film thickness of the magnetization free layer 7 was selected to be 2 nm.

SAMPLE 5

A TEG was obtained in a similar manner to that of the sample 1 except that the composition of the magnetization free layer 7 was selected to be Co90Fe10 (atomic percent) and that the film thickness of the magnetization free layer 7 was selected to be 2 nm.

Then, the R-H curves of the TEGs of the thus obtained respective samples 1 to 5 were measured and the fluctuations of coercive force and rectangle ratios were measured from the resultant R-H curves as follows.

Measurement of R-H Curves

In the ordinary magnetic memory device such as the MRAM, information may be written by inverting the magnetization direction of a magnetoresistive effect element with application of a current magnetic field. In the inventive examples, the magnetoresistive effect element was magnetized with application of external magnetic fields and resistance values thereof were measured. Specifically, first, external magnetic fields for inverting the magnetization direction of the magnetization free layer of the TMR element 22 were applied to the magnetization free layer in parallel to the easy axis of magnetization of the magnetization free layer. The magnitude of the external magnetic field for measurement was selected to be 500 Oe.

Next, at the same time the magnetization free layer was swept in a range of from −500 Oe to +500 Oe as seen from one side of the easy axis of magnetization of the magnetization free layer, a tunnel current is caused to flow through the ferromagnetic tunnel junction while a bias voltage applied to the terminal pad 23 of the word line WL and the terminal pad 24 of the bit line BL is being adjusted to reach 100 mV. Then, the R-H curves were obtained by measuring the resistance values against respective external magnetic fields obtained at that time.

Fluctuattion of Coercive Force Hc

The R-H curves were measured by the above-described measurement method. Then, mean values between resistance values measured in the condition in which magnetizations of the magnetization fixed layer and the magnetization free layer are in the anti-parallel state and in which resistance values are high and resistance values measured in the condition in which magnetizations of the magnetization fixed layer and the magnetization free layer are parallel to each other and in which resistance values are low were measured from the R-H curves thus obtained, and a value of an external magnetic field obtained when the resistance value of this mean value is obtained was determined as a coercive force Hc. This coercive force Hc was obtained from 500 elements (TEGs) thus similarly manufactured and a standard deviation .Hc was obtained. Then, Hc/ (mean value of Hc) was determined as a value of fluctuation of the coercive force Hc.

From a standpoint of improving write characteristics, the fluctuation of the coercive force Hc should preferably be suppressed to be less than 6%, more preferably, the fluctuation of the coercive force HC should be suppressed to be less than 4%.

Rectangle Ratio

Rectangle ratios of waveforms were measured from the R-H curves. Specifically, a ratio of R1max-R1min of R-H curve obtained in a range of magnetic fields from −500 Oe to +500 Oe for measurement and R2max-R2min obtained without magnetic field (H=0), i.e. value of (R2max-R2min)/(R1max-R1min) was calculated and the value thus calculated was determined as a rectangle ratio.

From a standpoint of improving write characteristics, the rectangle ratio should preferably be greater than 0.9.

The following table 1 shows the compositions and film thicknesses of the magnetization free layers 7 of the respective samples 1 to 5 and the following table 2 shows the fluctuations of the coercive force Hc and the rectangle ratios.

TABLE 1

| Sample No. | Layer arrangement | Composition of magnetization free layer (atomic %) | Film thickness (nm) |
|---|---|---|---|
| 1 | 1 | Co72Fe8B20 | 4 |
| 2 | 1 | Co70.5Fe4.5Si15B10 | 4 |
| 3 | 1 | Co81Zr4Nb12Ta3 | 4 |
| 4 | 1 | Co75Fe25 | 2 |
| 5 | 1 | Co90Fe10 | 2 |

TABLE 2

| Sample No. | Layer arrangement | RFA | Fluctuation of coercive force Hc | Rectangle ratio |
|---|---|---|---|---|
| 1 | 1 | Not annealed by RFA | 5.0 | 0.85 |
|   |   | Annealed by RFA | 3.9 | 0.90 |
| 2 | 1 | Not annealed by RFA | 4.3 | 0.88 |
|   |   | Annealed by RFA | 3.5 | 0.91 |
| 3 | 1 | Not annealed by RFA | 5.3 | 0.80 |
|   |   | Annealed by RFA | 4.1 | 0.86 |
| 4 | 1 | Not annealed by RFA | 6.0 | 0.80 |
|   |   | Annealed by RFA | 5.7 | 0.81 |
| 5 | 1 | Not annealed by RFA | 7.5 | 0.60 |
|   |   | Annealed by RFA | 7.3 | 0.60 |

From the table 2, it can be understood that if the magnetization free layer 7 is made of the amorphous material and annealed by rotating field anneal as in the samples 1 to 3, then it is possible to suppress the fluctuations of the coercive force Hc.

From this, it is to be understood that if the magnetization free layer 7 is made of the amorphous material and annealed by rotating field anneal, then the fluctuations of the coercive force Hc of the TMR element can be suppressed and the write characteristics of the MRAM can be improved.

Further, it is to be understood that if even an alloy that is generally crystallized has a film thickness selected to be less than 3 nm as in the samples 4 and 5, then the fluctuations of the coercive force Hc can be decreased a little by annealing the magnetization free layer 7 made of such crystallized alloy with rotating field anneal and the following static field anneal.

The magnetoresistive effect element (TMR element and the like) according to the present invention is not limited to the aforementioned magnetic memory device and can be applied to a magnetic head, a hard disk drive having this magnetic head mounted thereon, a magnetic sensor, an integrated circuit chip and various electronic devices such as personal computers, personal digital assistants and mobile phones and electronic devices.

According to the magnetoresistive effect element and the manufacturing method thereof of the present invention, the rectangle property of the R-H curve can be improved and the fluctuations of the coercive force can be improved.

Thus, when the magnetoresistive effect element according to the present invention is applied to the magnetic memory device, write errors can be decreased and hence excellent write characteristics can be obtained.

Furthermore, according to the magnetic memory device and the manufacturing method thereof of the present invention, it is possible to realize excellent write characteristics.

Having described a preferred embodiment of the invention with reference to the accompanying drawings, it is to be understood that the invention is not limited to that precise embodiment and that various changes and modifications could be effected therein by one skilled in the art without departing from the scope of the invention as defined in the appended claims.

What is claimed is:

1. A magnetoresistive effect element which comprises a pair of ferromagnetic material layers opposed to each other with an intermediate layer therebetween to provide for a magnetoresistive change defining information which is read by applying a current flowing in a direction perpendicular to surfaces of the ferromagnetic material layers, and wherein a resistance of the element is determined by applying the current flowing perpendicular to the layers, wherein at least one of said ferromagnetic material layers is annealed during application of a rotating magnetic field and subsequently during application of a static magnetic field.

2. A magnetoresistive effect element according to claim 1, wherein at least one of said ferromagnetic material layers is made of an amorphous or microcrystal material.

3. A magnetoresistive effect element according to claim 1, wherein said magnetoresistive effect element is a tunnel magnetoresistive effect element using a tunnel barrier layer made of an insulating or semiconductor material as said intermediate layer.

4. A magnetoresistive effect element according to claim 1, wherein said magnetoresistive effect element has a laminated ferri structure.

5. A magnetoresistive effect element according to claim 1, wherein fluctuation of a coercive force $H_C$ is suppressed to be less than 6%, and a measured rectangle ratio is greater than 0.9.

6. A magnetoresistive effect element according to claim 1, wherein patterning of the magnetoresistive effect element is effected subsequent to the annealing of said at least one ferromagnetic material layer.

7. A magnetoresistive effect element according to claim 1, wherein fluctuation of a coercive force $H_C$ is suppressed to be less than 6%.

8. A magnetoresistive effect element according to claim 1, wherein a measured rectangle ratio is greater than 0.9.

9. A magnetic memory device comprising:

a magnetoresistive effect element which has an arrangement in which a pair of ferromagnetic material layers are opposed to each other with an intermediate layer therebetween to provide for a magnetoresistive change defining information which is read by applying a current flowing in a direction perpendicular to the surfaces of the ferromagnetic material layers and wherein a resistance of the element is determined by applying the current flowing in a direction perpendicular to the layers; and word lines and bit lines sandwiching said magnetoresistive effect element in the thickness direction, wherein at least one of said ferromagnetic material layers is annealed during application of a rotating magnetic field and subsequently during application of a statiz magnetic field.

10. A magnetic memory device according to claim 9, wherein at least one of said ferromagnetic material layers is made of an amorphous or microcrystal material.

11. A magnetic memory device according to claim 9, wherein said magnetoresistive effect element is a tunnel magnetoresistive effect element using a tunnel barrier layer made of an insulating or semiconductor material as said intermediate layer.

12. A magnetic memory device according to claim 9, wherein said magnetoresistive effect element has a laminated ferri structure.

13. A magnetic memory device according to claim 9, wherein patterning of the magnetoresistive effect element is effected subsequent to the annealing of said at least one ferromagnetic material layer.

* * * * *